United States Patent

Tung

[11] Patent Number: 5,976,923
[45] Date of Patent: Nov. 2, 1999

[54] METHOD FOR FABRICATING A HIGH-VOLTAGE SEMICONDUCTOR DEVICE

[75] Inventor: Ming-Tsung Tung, Hsinchu Hsien, Taiwan

[73] Assignee: United Microelectronics Corp., Hsinchu, Taiwan

[21] Appl. No.: 09/209,366

[22] Filed: Dec. 8, 1998

[51] Int. Cl.[6] .............................................. H01L 21/8238
[52] U.S. Cl. ..................... 438/228; 438/232; 438/419; 438/519; 438/275
[58] Field of Search .................... 438/201, 216, 438/217, 220, 219, 223, 224, 227, 228, 231, 232, 263, 264, 275, 279, 289, 414, 418, 419, 420, 423, 451, 514, 519, 529, 591

[56] References Cited

U.S. PATENT DOCUMENTS

| | | | |
|---|---|---|---|
| 5,376,568 | 12/1994 | Yang | 438/298 |
| 5,501,994 | 3/1996 | Mei | 438/200 |
| 5,550,064 | 8/1996 | Yang | 438/228 |
| 5,747,850 | 5/1998 | Mei | 257/328 |
| 5,831,320 | 11/1998 | Kwon et al. | 257/409 |
| 5,907,173 | 5/1999 | Kwon et al. | 257/336 |

*Primary Examiner*—Charles Bowers
*Assistant Examiner*—Jack Chen
*Attorney, Agent, or Firm*—Oppenheimer Wolff & Donnelly LLP; Chien-Wei Chris Chou; Robert O. Guillot

[57] ABSTRACT

A method for fabricating high-voltage semiconductor devices is disclosed, in which a P-well and a N-well are first formed over the substrate, where a plurality of P-wells and N-wells used as isolation regions and drift regions are further formed therein. More shallot P-type and N-type regions are subsequently formed in the drift regions and isolation regions, so as to increase the breakdown voltage and enhance the current-driving performance. In addition, a deepened isolation doping, can also increase the latch up capability, resulting in less area required for fabricating a device.

13 Claims, 3 Drawing Sheets

METHOD FOR FABRICATING A HIGH-VOLTAGE SEMICONDUCTOR DEVICE

BACKGROUND OF THE INVENTION

1. Field of Invention

The present invention generally relates to a method for fabricating semiconductor devices, and more particularly to a method for fabricating a high-voltage semiconductor device.

2. Description of Related Art

High-voltage semiconductor devices are typically fabricated by reducing the doping concentration of drift regions to increase the breakdown voltage. However, the current-driving performance is also degraded by doing so. Also, a latch up capability of a device needs to be commensurate with high-voltage applications. Although the layout rule can be relaxed to improve the latch up capability, extra area is required for fabricating, the device.

Conventionally, the high-voltage device is fabricated by using an isolation layer to increase the distance between the source/drain regions and the gate, so that the lateral electromagnetic field within the channel can be reduced. Also, drift regions underneath the isolation layer and the grade regions underneath the source/drain regions can be lightly doped to reduce a hot electron effect. In this way, the breakdown voltage at the junctions between the source/drain regions and the substrate can be increased and the leakage current therein can be avoided.

FIGS. 1 to 3 show cross sectional views of a portion of a conventional high-voltage semiconductor device. Referring first to FIG. 1, a P-type lightly-doped substrate 100, N-type lightly-doped regions 101, N-type heavily-doped regions 102, and a gate layer 103 are depicted, in which the N-type heavily-doped regions 102 are the source/drain regions, while the N-type lightly-doped regions 101 are used to increase the breakdown voltage at the junctions between the source/drain regions 102 and the substrate 100.

Referring to FIG. 2, a P-type lightly-doped substrate 110, N-type lightly-doped regions 111, N-type heavily-doped regions 112, spacers 113, and a gate layer 114 are depicted, in which the N-type heavily-doped regions 112 are the source/drain regions, while the N-type lightly-doped regions 111 and the spacers 113 can be used to increase the distance between the source/drain regions 112 and the gate 114.

Referring to FIG. 3, a P-type lightly-doped substrate 120, N-type lightly-doped regions 121, N-type heavily-doped regions 122, field oxide (FOX) layers 123, and a gate layer 124 are depicted, in which the N-type heavily-doped regions 122 are the source/drain regions. while the N-type lightly-doped regions 121 and the FOX layers 123 can be used to increase the junction breakdown voltage between the source/drain regions 122 and the substrate 120.

Generally, the high-voltage semiconductor devices are fabricated by reducing the doping concentration of the drift region to increase the breakdown voltage. However. the current-driving performance is also degraded. Also, the latch up capability of the device needs to be commensurate with high-voltage applications. Although the layout rule can be relaxed to improve the latch up capability, extra area is required for fabricating the device.

SUMMARY OF THE INVENTION

It is therefore an objective of the present invention to provide a method for fabricating high-voltage semiconductor devices, in which a P-well and a N-well are first formed, where a plurality of P-wells and N-wells used as isolation regions and drift regions are further formed therein. More shallow P-type and N-type regions are subsequently formed in the drift regions and isolation regions, so as to increase the breakdown voltage and enhance the current-driving performance. In addition, a deepened isolation doping can also increase the latch up capability, resulting in less area required for fabricating a device.

It is another objective of the present invention to provide a method for fabricating complimentary semiconductor devices having high-voltage enduring capability, so as to facilitate the fabrication of semiconductor devices with higher voltage enduring capability, and extend the application areas that semiconductor devices can apply to.

It is another objective of the present invention to provide a method for fabricating high-voltage semiconductor devices, in which more shallow P-type and N-type regions in the drift regions and isolation regions are formed to significantly increase the breakdown voltage at the junctions between the source/drain regions and the substrate, and enhance the current-driving performance.

In accordance with the foregoing and other objectives of the present invention, a method for fabricating a high-voltage semiconductor device is provided, in which a P-well and a N-well are first formed, where a plurality of P-wells and N-wells used as isolation regions and drift regions are further formed therein. More shallow P-type and N-type regions are subsequently formed in the drift regions and isolation regions, so as to enhance the current-driving, performance and latch-up capability which subsequently results in less area required for fabricating a semiconductor device. In addition, more shallow P-type and N-type regions in the isolation regions and drift regions can increase the breakdown voltage at the junctions between the source/drain regions and the substrate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and. together with the description, serve to explain the principles of the invention. In the drawings.

DESCRIPTION OF THE PREFERRED EMBODIMENTS

Figure 1:
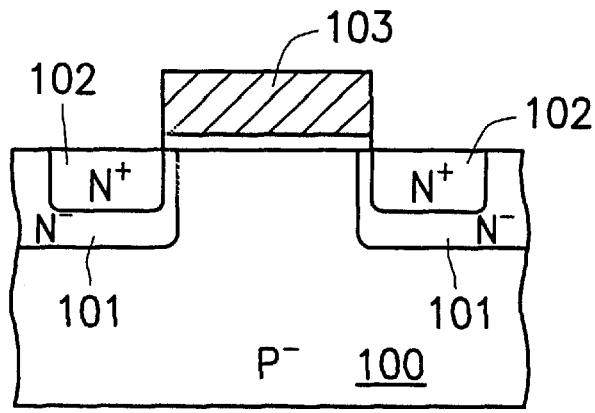
FIGS. 1 to 3 are cross sectional views of a portion of a conventional high-voltage semiconductor device.
Figure 2:
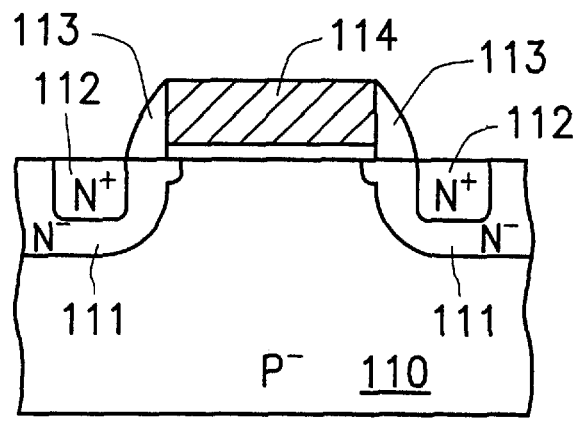
Figure 3:
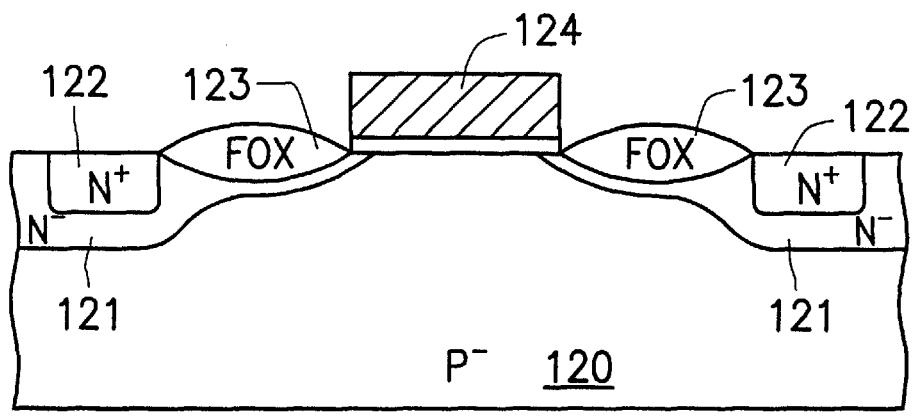

Reference will now be made in detail to the present preferred embodiments of the invention, examples of which are illustrated in the accompanying drawings. Wherever possible, the same reference numbers are used in the drawings and the description to refer to the same or like parts.

Figure 4A:
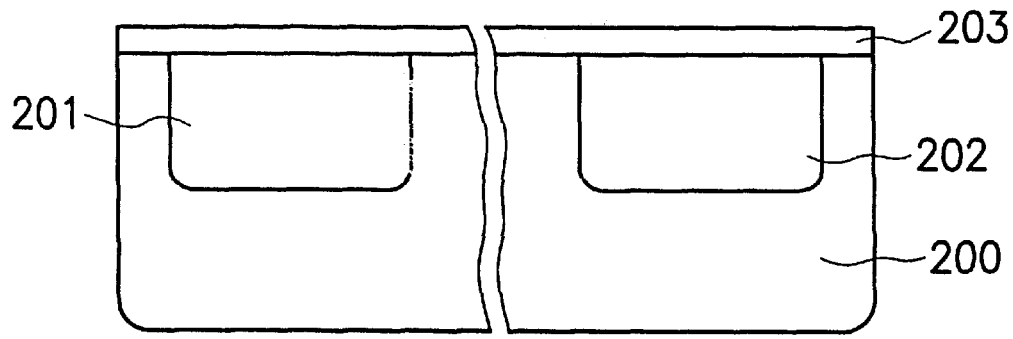
FIGS. 4A to 4F are cross sectional views of a portion of a device illustrating a fabricating process for a high-voltage semiconductor device according, to a preferred embodiment of the present invention.

FIGS. 4A to 4F show cross sectional views of a portion of a device illustrating a fabricating process for a high-voltage semiconductor device according to a preferred embodiment of the present invention. Refer first to FIG. 4A. where a high-voltage semiconductor device is provided, including a substrate 200 made of, for example, a N-type or a P-type silicon material. A first P-well 201 and a first N-well 202 are formed by, for example. implanting, a P-type dopant and a N-type dopant into the substrate, respectively, Subsequently, a silicon oxide layer 203 is formed thereon over the substrate, by using, for example, a thermal oxidation.

Figure 4B:
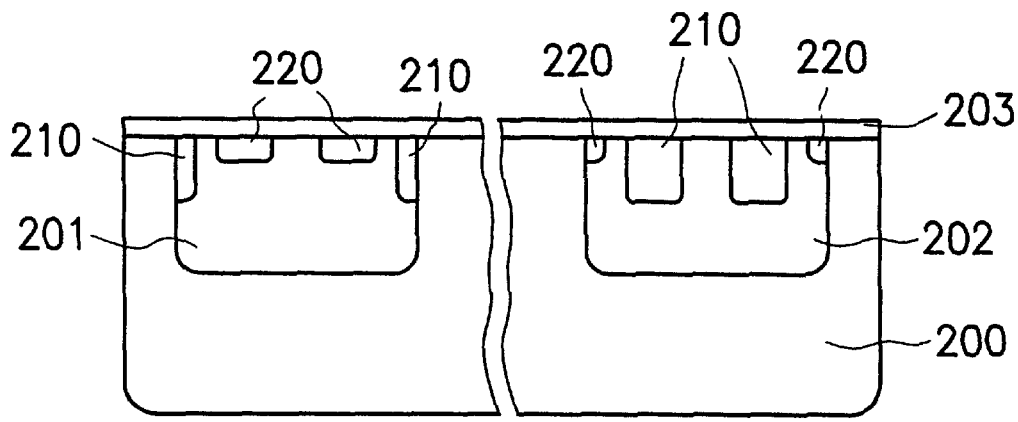

Reference is made to FIG. 4B, where a mask is used to cover the substrate 200 to expose portions of the first P-well 201 to allow a N-type dopant and a P-type dopant to implant into the P-well 201. Similarly, a mask is used to cover the substrate 200 to expose portions of the first N-well 202, and a N-type dopant and P-type dopant are implanted into the N-well 202. A drive-in process is then applied on the substrate to form a plurality of second P-wells 210 and second N-wells 220 on the first P-well 201. Similarly, a plurality of second P-wells 210 and second N-wells 220 are formed on the first N-well 202.

Figure 4C:
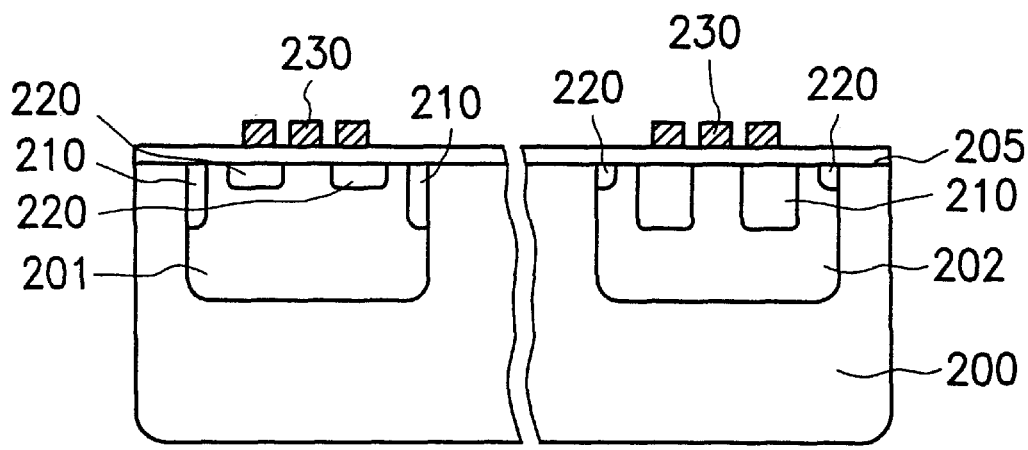

As shown in FIG. 4C, the silicon oxide layer 203 is removed and an oxide layer 205 is subsequently formed over the substrate by an oxidation method, for example, a thermal oxidation. Therefore the oxide layer 205 is also called a pad oxide. A silicon nitride layer 230 is then deposited over the substrate, and is patterned via a mask to obtain selected portions for the silicon nitride layer 230. The silicon nitride layer 230 is formed by a deposition method, for example, a chemical vapor deposition (CVD).

Figure 4D:
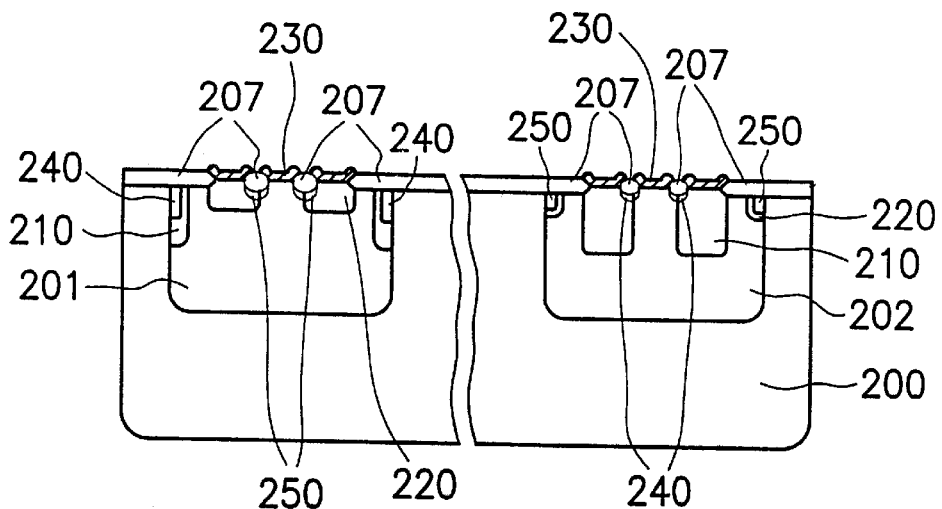

Refer to FIG. 4D, where a P-type dopant is lightly-doped into the substrate 200 via a mask forming a plurality of P-type drift regions 240 on the second P-wells 210 and 14 the N-well 202, while a N-type dopant is lightly-doped into the substrate 200 via a mask forming a plurality of N-type drift regions 250 on the second N-wells 220 and in the first P-well 201. An oxidation method, for example, a wet oxidation, is performed over the substrate forming a plurality of field oxide (FOX) layers 207 between the remaining portions of the silicon nitride layers 230.

Figure 4E:
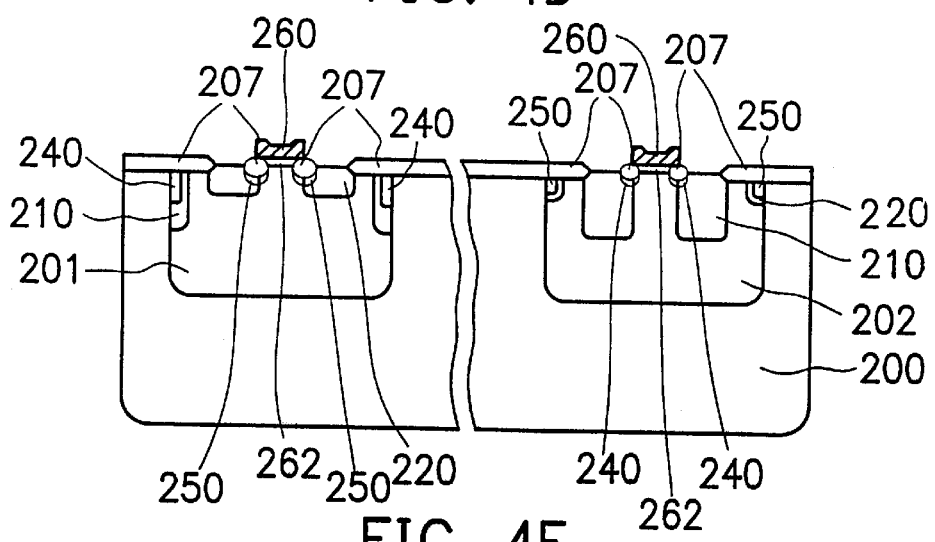

Reference is made to FIG. 4E, where the silicon nitride layer 230 and pad oxide layer 205 are successively removed by, for example, a wet etching method, where a hot phosphoric acid solution is used to remove the silicon nitride layer 230, and a hydrofluoric acid solution is then used to remove the pad oxide layer 205. In addition, the substrate 200 is patterned via a mask to form a gate oxide layer 262 by using, for example. the CVD, a low pressure chemical vapor deposition (LPCVD), or the thermal oxidation. Subsequently a polysilicon layer is formed on the Irate oxide layer 262, and is patterned via a mask to form a polysilicon gate 260 using a deposition technique such as low pressure chemical vapor deposition (LPCVD).

Figure 4F:
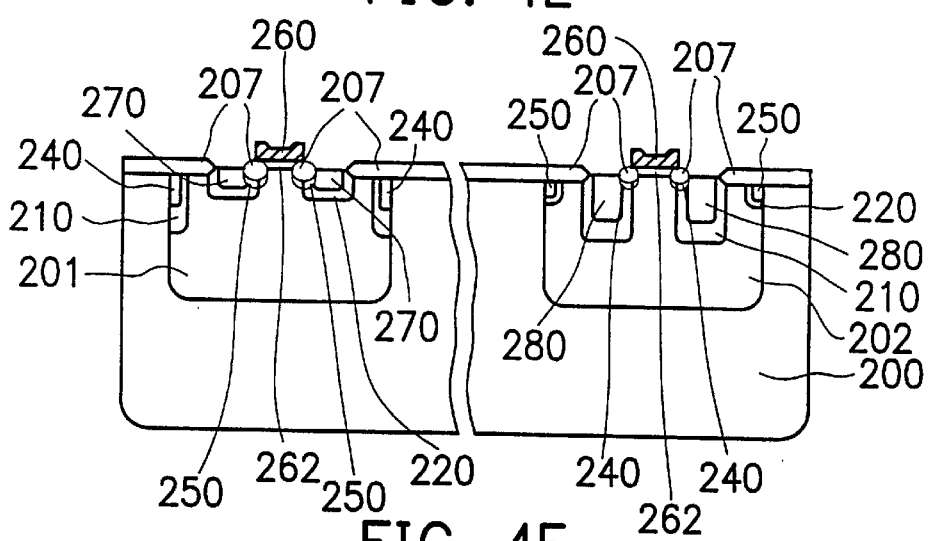

Now refering to FIG. 4F, a plurality of N-type heavily doped source/drain regions 270 are formed by implanting a N-type dopant into the N-wells 220. Similarly, a plurality of P-type heavily doped source/drain regions 280 are formed by implanting a P-type dopant into the P-wells 210. Finally, an annealing process is performed on the substrate 200 to transform the unstructured amorphous silicon into a crystal state. The annealing process however will slightly drive in some dopants into the substrate, As a summary the present invention has the following characteristics:

(1) The high-voltage semiconductor device is fabricated by successively forming a first P-well 201 and a first N-well 202 over the substrate, then forming a plurality of second P-wells 210 and a plurality of second N-wells 220 as the isolation regions, source/drain regions, and drift regions. Finally the more shallow P-type regions 240 and N-type regions 250 are formed in the drift regions and isolation regions, so that the breakdown voltage at the junctions between the source/drain regions and the substrate can be increased, and the current-driving performance can be enhanced, according to the preferred embodiment of the present invention.

(2) The high-voltage semiconductor device is fabricated by forming the first wells, and subsequently forming the second wells to be used as the isolation regions, source/drain regions, and drift regions, where more shallow regions can be formed thereon. Tile structure with a deepened isolation doping can increase the latch-up capability and reduce the area required for fabricating a device according to the preferred embodiment of the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a high-voltage semiconductor device, comprising the steps of:

providing a substrate;

forming a first P-well and a first N-well in the substrate;

forming a first silicon oxide layer over the substrate;

forming a plurality of second P-wells and second N-wells in the first P-well and first N-well;

removing the first silicon oxide layer;

forming a second silicon oxide layer over the substrate;

forming a patterned silicon nitride layer on the second silicon oxide layer;

forming a plurality of P-type drift regions in the second P-wells within the first P-well and the first N-well;

forming a plurality of N-type drift regions in the second N-wells within the first N-well and the first P-well;

forming a field oxide layer between remaining portions of the silicon nitride layer on the substrate;

removing the silicon nitride layer and the second silicon oxide layer;

forming a gate oxide layer over the substrate and patterning the gate oxide layer by a mask which covers portions between every two adjacent P-type drift regions and every two adjacent N-type drift regions;

forming a plurality of patterned polysilicon gates on the gate oxide layer; and forming a plurality of N-type heavily doped regions in the second N-wells and a plurality of P-type heavily doped regions in the second P-wells.

2. The method of claim 1, wherein the step of forming the first P-well and first N-well comprises implanting P-type dopants and N-type dopants into the substrate; and performing a drive-in process to form the first P-well and the first N-well.

3. The method of claim 1, wherein the step of forming the second P-wells and second N-wells comprises implanting P-type dopants and N-type dopants into the first P-well and first N-well; performing a drive-in process to form the second P-wells and the second N-wells.

4. The method of claim 1, wherein the P-type drift regions are formed by implanting P-type dopants, and the N-type drift regions are formed by implanting N-type dopants.

5. The method of claim 1, wherein the N-type heavily-doped regions are formed in the first P-well. And the P-type heavily-doped regions are formed in the first N-well.

6. The method of claim 1, wherein the first silicon oxide layer is formed by thermal oxidation.

7. The method of claim 1, wherein the silicon nitride layer is formed by chemical vapor deposition.

8. The method of claim 1, wherein the silicon nitride layer is patterned by wet etching.

9. The method of claim 1, wherein the field oxide layer is formed by wet oxidation.

10. The method of claim 1, wherein the step of removing the silicon nitride layer and the second silicon oxide layer comprises a wet etching, wherein the wet etching comprises using a hot phosphoric acid solution to remove the silicon nitride layer; and using a hydrofluoric acid solution to remove the second silicon oxide layer.

11. The method of claim 1, wherein the gate oxide layer is formed by low pressure chemical vapor deposition (LPCVD).

12. The method of claim 1, wherein the gate oxide layer is formed by thermal oxidation.

13. The method of claim 1, wherein the polysilicone gate is formed by low pressure chemical vapor deposition (LPCVD).

* * * * *